United States Patent [19]

Sepehry-Fard

[11] Patent Number: 5,725,659
[45] Date of Patent: Mar. 10, 1998

[54] SOLID PHASE EPITAXY REACTOR, THE MOST COST EFFECTIVE GAAS EPITAXIAL GROWTH TECHNOLOGY

[76] Inventor: Fareed Sepehry-Fard, 7790 Gouin West, Montreal, Quebec, Canada, H4K 2K2

[21] Appl. No.: 587,782

[22] Filed: Dec. 26, 1995

Related U.S. Application Data

[63] Continuation-in-part of Ser. No. 322,292, Oct. 3, 1994, abandoned.
[51] Int. Cl.⁶ .................................................. C30B 25/02
[52] U.S. Cl. .......................... 117/84; 117/109; 117/200
[58] Field of Search .............................. 117/200, 84, 109

[56] References Cited

U.S. PATENT DOCUMENTS

| | | | |
|---|---|---|---|
| 3,065,113 | 11/1962 | Lyon | 117/109 |
| 4,147,572 | 4/1979 | Vodakov et al. | 117/84 |
| 4,299,649 | 11/1981 | Gentile et al. | 117/109 |
| 4,382,837 | 5/1983 | Rutz | 117/84 |
| 4,648,917 | 3/1987 | Kay et al. | 117/109 |
| 4,737,232 | 4/1988 | Fliestein et al. | 117/927 |

FOREIGN PATENT DOCUMENTS

| | | | |
|---|---|---|---|
| 61-251591 | 11/1986 | Japan | 117/109 |
| 62-256792 | 11/1987 | Japan | 117/84 |
| 649454 | 2/1979 | U.S.S.R. | 117/84 |
| 92 15731 | 9/1992 | WIPO | 117/109 |

*Primary Examiner*—Robert Kunemund
*Attorney, Agent, or Firm*—Swabey Ogilvy Renault

[57] ABSTRACT

Apparatus for performing SPE deposition for growing layers of semiconductive material includes a reaction chamber and means for mounting a substrate wafer and a source wafer in the reaction chamber. The substrate wafer and the source wafer are maintained at a predetermined distance which is less than the mean free path of the reactive species of the oxido-reduction of the semiconductive material. A heater for heating the wafers maintains a temperature difference of 20° C. to 40° C. between the wafers.

6 Claims, 7 Drawing Sheets

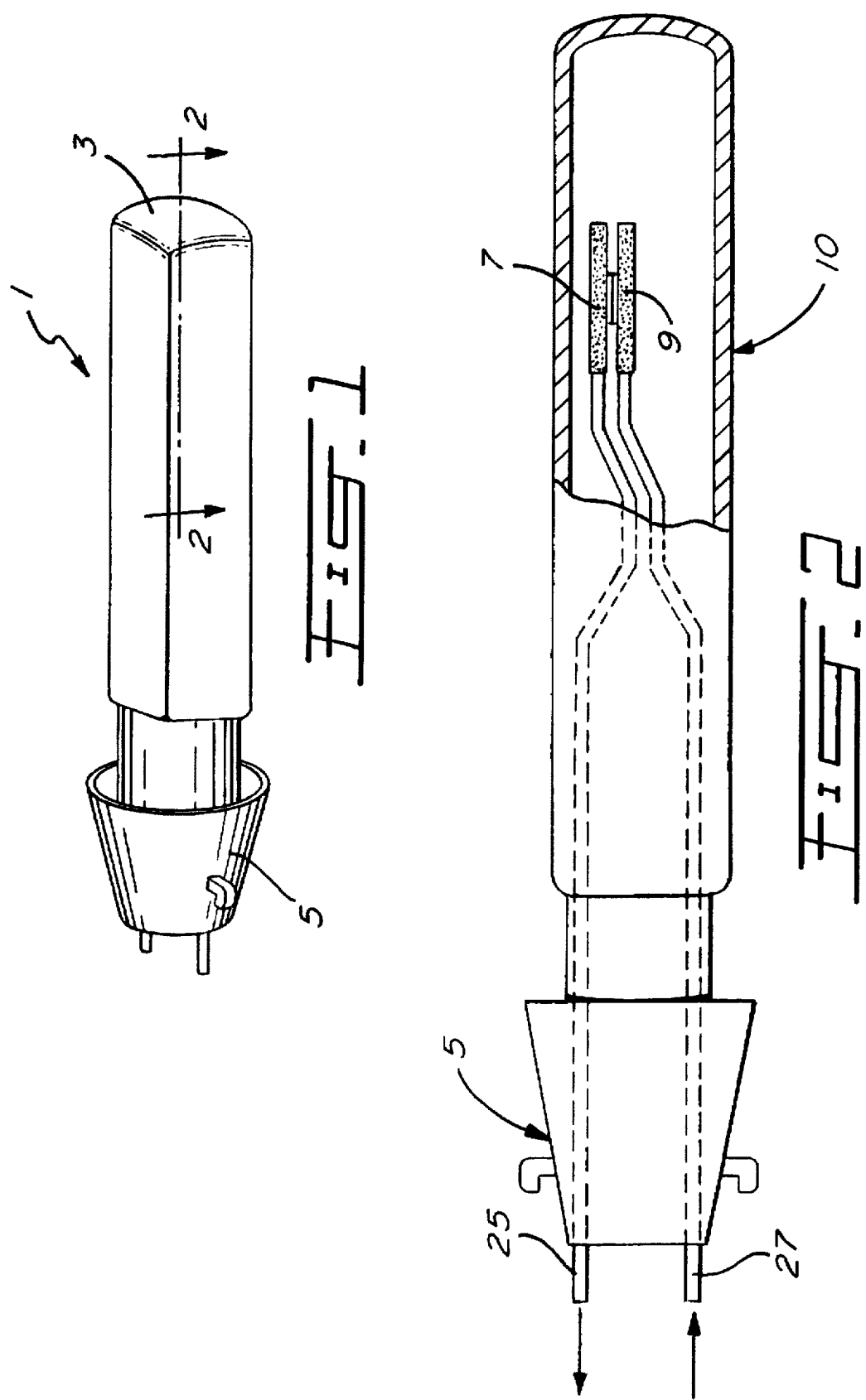

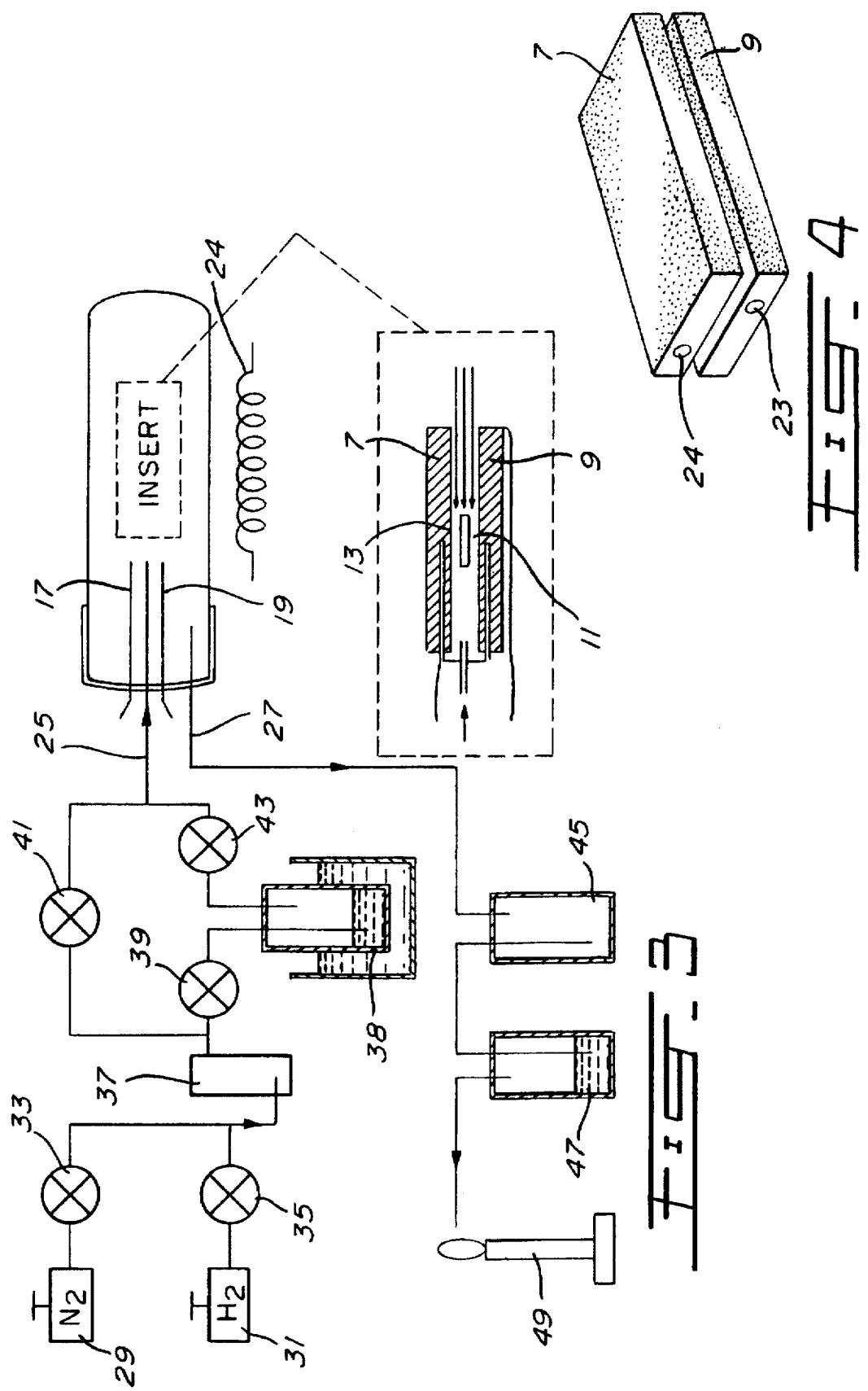

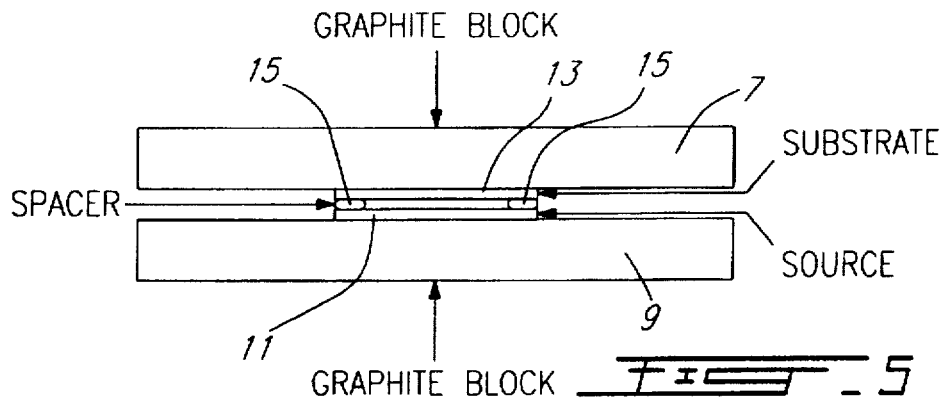
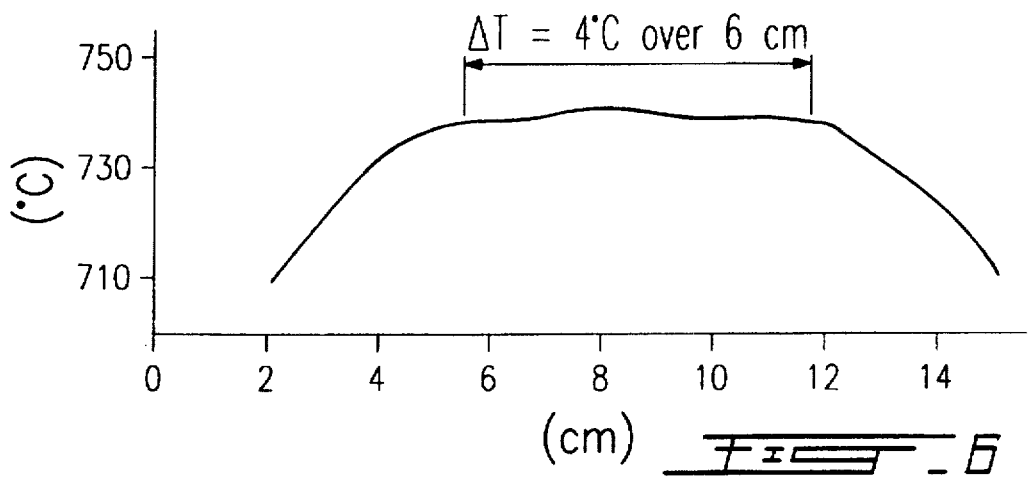
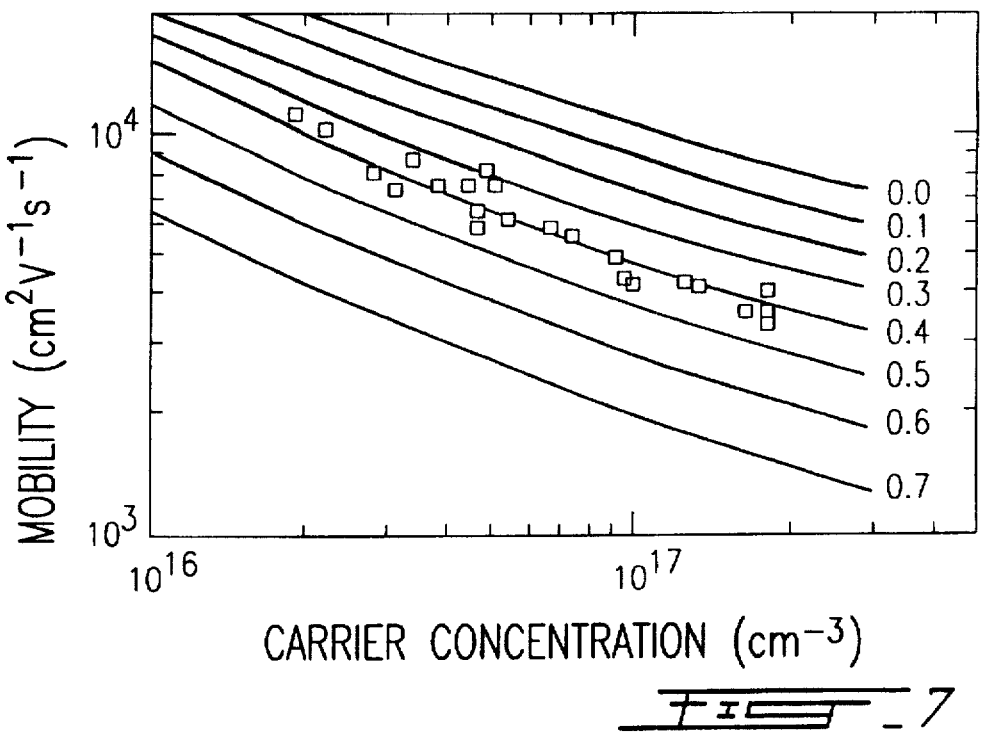

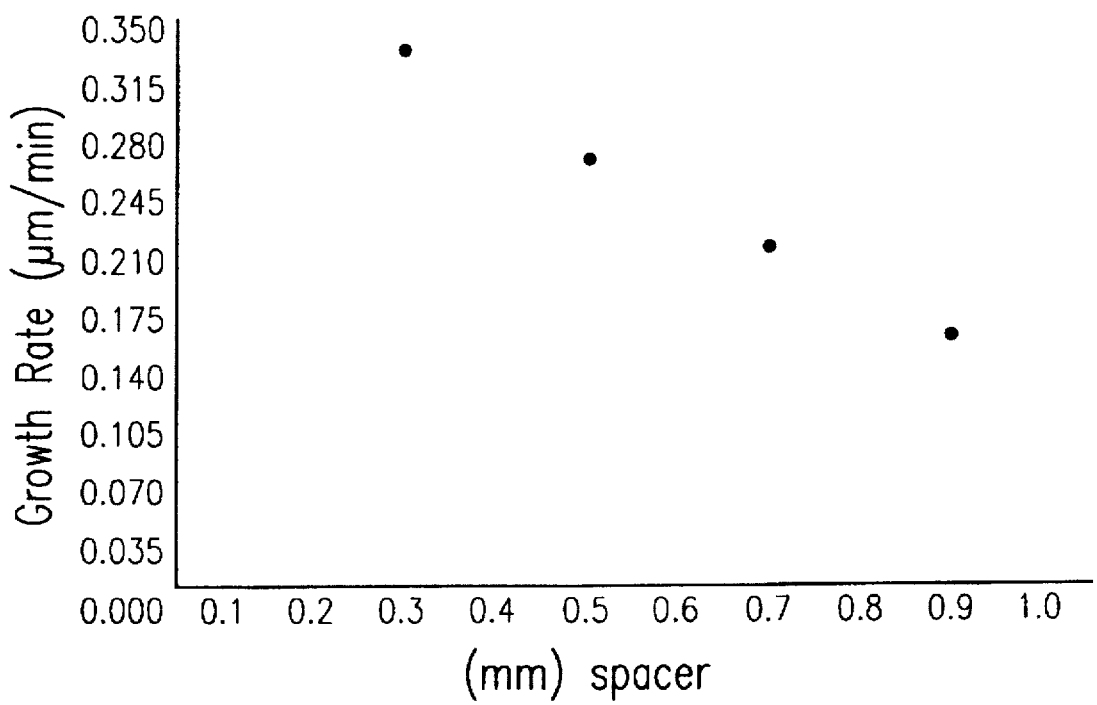
FIG_11
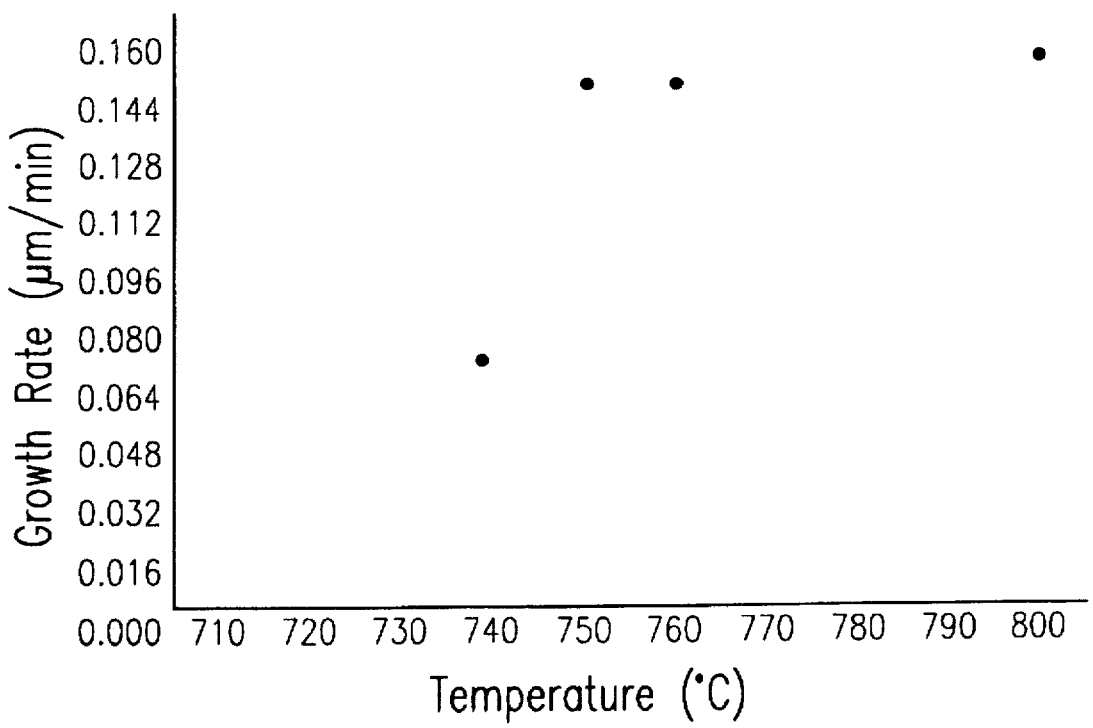
FIG_12

1

SOLID PHASE EPITAXY REACTOR, THE MOST COST EFFECTIVE GAAS EPITAXIAL GROWTH TECHNOLOGY

This application is a continuation-in-part of U.S. Ser. No. 08/322,292 filed Oct. 3, 1994, now abandoned.

FIELD OF THE INVENTION

The invention relates to a solid phase epitaxial (SPE) deposition process. The invention also relates to an apparatus for carrying out the process.

More specifically, the invention relates to an SPE process to grow polycrystalline, homo-epitaxial and hetero-epitaxial layers of semiconductor material, with a special focus on GaAs, and to apparatus for carrying out the process.

BACKGROUND OF THE INVENTION

The analysis of deep level curves clearly indicate the role of vacancy doping of GaAs. In the case of the "undoped" semi-insulating (SI) GaAs of the EL2 antisite donor complexes in n-type arsenic rich layers evoke the presence of deep lying acceptor levels. They seem to originate from the phase extent introduced off-stoichiometry. As a result, the very bothersome and unsolved problem of the thermal stability of GaAs is related to stoichiometry control. SPE is well suited for controlled stoichiometry growth since the driving force of the solid source to substrate epitaxial transport reaction is the displacement of the chemical equilibrium constants according to their respective temperatures. Thus, it is proven that by the systematic adjustment of these temperatures the stoichiometry, i.e., the defect structure of the deposited GaAs layers is controlled. Then, measurements of the transport properties coupled with the analysis of deep level transient spectroscopy (DLTS) data lead to the quantitative elucidation of the deep levels compensation mechanisms in SI GaAs. Thus, the conditions of the growth of thermally stable GaAs for optoelectric and GaAs integrated circuitry technology is established.

Transport properties measurements indicate that the quantity of the deposited epitaxial layers are comparable to the ones obtained by other epitaxial processes. The DLTS data combined with transport properties results indicate the occurrence of phase extent induced off-stoichiometry. This gives rise to the formation of vacancies. Multi-level impurity analysis, based on the Shockley curves demonstrate major importance of the deep lying levels in the electrical behaviour and thermal stability of SI GaAs.

SUMMARY OF INVENTION

It is an object of the invention to provide a SPE deposition process which overcomes the disadvantages of the prior art.

It is a further object of the invention to provide an apparatus for carrying out the process.

In accordance with a broad aspect of the invention, the SPE process is characterized by a reduced spacing between a source and a substrate which is less than the mean free path of the reactive species of the oxido-reduction of GaAs.

Such an arrangement minimizes the gas phase mass transfer control in favour of surface reaction rate control of this chemical vapor deposition (CVD) process.

Thus, the role of low pressure use in the liquid phase chemical vapor deposition (LPCVD) is replaced by the reduced source-substrate separation at atmospheric working pressure.

Raw materials used will primarily consist of GaAs, gases, chemical reagents and quartz.

The SPE technique can be used for the epitaxial growth of any solid which can react reversibly with a gas. This technique has the advantage of working under atmospheric pressure, using moderate temperature. The source and substrate may be separated by a fraction of a millimeter using a spacer such as fused silica or graphite. The transporting agent may be water vapor which is brought into the reaction chamber by a gas via a water saturator. The source and substrate are heated such that the chemical transport from the source to the substrate can be achieved. This is accomplished by establishing a temperature difference, $\Delta T$, between the source and substrate such that the source temperature is greater than the substrate temperature. The reduced spacing of the source and substrate ($\cong 0.3$ mm), which is in the range of the mean free path of the reacting species, has many advantages. The reaction is limited at the two surfaces only. This minimizes any side reaction in the gas phase between the source and the substrate. This is similar to the condition of low pressure chemical vapor deposition without the requirement of low pressure. The epitaxial growth is also fast and efficient and is independent of gas flow rates and reactor geometry.

The general characteristics of a SPE system are as follows. A reaction chamber preferably made of fused silica has a gas inlet and outlet which allow the gaseous transporting agent to circulate inside the reactor. The gas inlet is brought near the source and substrate where the mass transport occurs. The source and substrate are placed between blocks, preferably made of graphite, which are supported inside the reactor. The blocks may act as heat susceptors to homogenize the temperature at the source and substrate. The temperature is monitored using, for example, thermocouples. Finally a heating system provides the necessary energy for the reaction to occur.

In accordance with a particular embodiment of the invention there is provided a deposition process for growing uniform thickness layers of material, comprising: disposing a source wafer and a substrate wafer substantially parallel to one another within a reaction chamber, the source wafer comprising the material; providing a transport agent vapor in the chamber substantially at atmospheric pressure; causing the vapor to flow substantially evenly across the wafers; setting a space between the source wafer and the substrate wafer to less than a mean free path of a reactive species of oxido-reduction of the material; heating the source wafer and the substrate wafer substantially evenly with a difference in temperature between the source wafer and the substrate wafer; and maintaining the temperature difference between the source wafer and the substrate wafer to effect deposition of the material transported from the source wafer to the substrate wafer as a result of oxido-reduction reaction of the material, the vapor and the substrate.

From a different aspect, and in accordance with a particular embodiment of the invention there is provided an apparatus for performing deposition for growing layers of a material on a substrate wafer, the material being transferred from a source wafer to the substrate wafer by a transport agent vapor as a result of oxido-reduction reaction, comprising: a reaction chamber able to contain the vapor at substantially atmospheric pressure; means for mounting the substrate wafer and the source wafer substantially parallel to one another in the reaction chamber; means for maintaining a spacing between the substrate wafer and the source wafer by a distance which is less than the mean free path of the reactive species of oxido-reduction of the material; gas outlet means for causing the vapor to flow substantially evenly across the wafers; means for substantially evenly heating the wafers; and means for maintaining a temperature difference between the wafers.

BRIEF DESCRIPTION OF DRAWINGS

The invention will be better understood by an examination of the following description, together with the accompanying drawings, in which:

FIG. 1 is a perspective view of a reaction chamber in accordance with the invention;

FIG. 2 is a section through 2—2 of FIG. 1;

FIG. 3 is a schematic diagram of the reaction chamber;

FIG. 4 illustrates the graphic blocks used in the reactive chamber;

FIG. 5 illustrates the relationship between the graphite blocks, the source, the substrate and the spacers in the reactive chamber;

FIG. 6 is a graph showing temperature variation along the graphite blocks;

FIG. 7 is a comparison of electron mobilities in n-type GaAs measured at 77K;

FIG. 11 is a plot of growth rate vs spacer thickness for the results of Example 2;

FIG. 12 is a plot of growth rate vs temperature in Example 2;

DESCRIPTION OF PREFERRED EMBODIMENTS

Figure 8A:
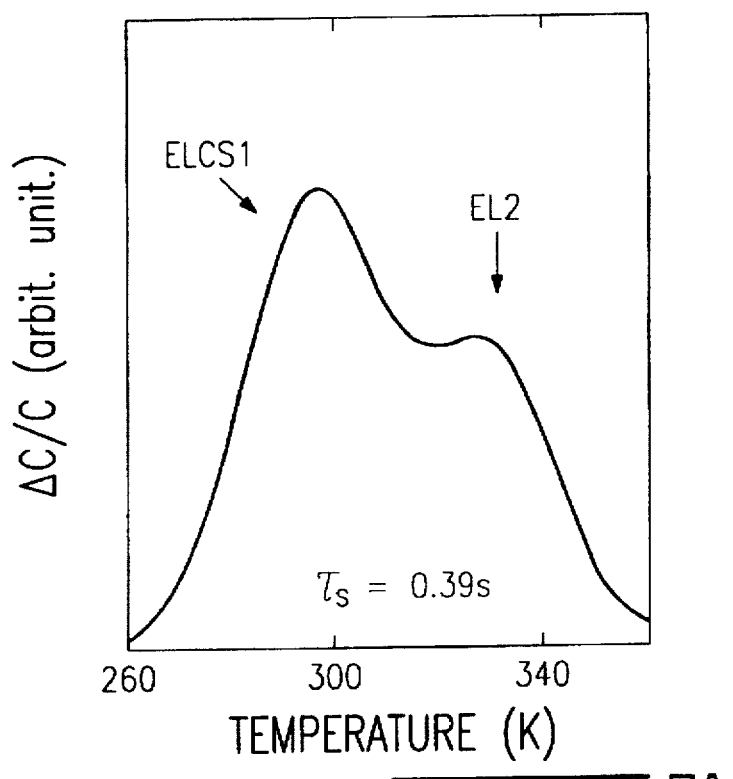
FIG. 8A represents a typical DLTS spectra for Schottky diode prepared on an As grown surface at a substrate temperature of 860°.

Before describing the preferred embodiments in detail, a general description of the SPE process will be provided. The growth of epitaxial layers by solid phase epitaxy is characterized by a small spacing between source and substrate. Because a direct transport of material is achieved, the chemical conditions are largely independent of parameters which define the system.

The transporting gas reacts with the source and substrate materials producing volatile compounds, which establish equilibrium partial pressures on those surfaces. As the source and substrate surface are at different temperatures, a concentration gradient of the reaction products appears, giving rise to a gas diffusion flux towards the surface with lower partial pressure. Then the reaction direction is reversed, producing the deposition of material on the substrate surface.

A characteristic of the III–V and II–VI compounds is the presence of one or more elements possessing a high elemental vapor pressure. Elements, such as P, As, Sb, as well as metals like Hg and Zn, all possess appreciable vapor pressures at typical growth temperatures. Thermal equilibrium between a solid and a gas phase environment requires both the metal and anion of the compound to be present in the vapor phase.

In the case of GaAs, the formation reaction is typically given by:

$$GaAs(s) \leftarrow \rightarrow Ga(l) + \tfrac{1}{2}As_2(g) \qquad [1]$$

The partial pressures of Ga and $As_2$ over and in equilibrium with GaAs must also take into account the equilibrium between liquid Ga and its own vapor:

$$Ga(l) \leftarrow \rightarrow Ga(v) \qquad [2]$$

At the growing interface, the mass action expression may be written as (1)

$$\frac{P_{Ga}\, P^{1/2}_{As_2}}{A_{GaAs}} = K_{GaAs} \qquad [3]$$

PGa: partial pressure of Ga over GaAs substrate
PAs₂: partial pressure of As₂
AGaAs: is the activity of GaAs taken to be equal to 1.

There is a range of Ga and As partial pressures which can exist in equilibrium with GaAs without the formation of additional phases such as Ga(l) and As(s).

Elemental arsenic has a high vapor pressure (PAs₂) so that it can be transported by direct sublimation.

PAs₂(800° C.)–2×10⁻⁷ atm (2) and it is obtained from equation $$\log_{10}(PAs_2/atm) = -\frac{1.933 \times 10^4}{T} + 11.53 \,(3) \qquad [4]$$

for T=800° c.=1073K ⇒ PAs₂=3.2×10⁻⁷ atm.

Gallium is also available in the vapor phase but its vapor pressure is negligible at growth temperatures, so that it must be transported in the form of a volatile compound.

$$\log_{10}(PGa(atm)) = -\frac{1.3574 \times 10^4}{T} + 5.551 \qquad [5]$$

for T=800° c.=1073K ⇒ PGa=8×10⁻⁸ atm four times lower than Arsenic pressure.

The flux of Ga to the surface is then $$JGa = DGa \frac{(P^{800}Ga - P^{750}Ga)}{dRT} = \frac{DGa\, \Delta P}{dRT} \qquad [6]$$

Where:
DGa: the diffusion coefficient for Ga in the vapor phase
P⁸⁰⁰Ga=Gallium vapor pressure in equilibrium with source
P⁷⁵⁰Ga=Gallium vapor pressure over GaAs substrate
d: distance between source and substrate
T: Growth temperature
R: ideal gas constant:
ΔP=6×10⁻⁸ atm calculated from equation [5] very weakly to involve a growth.
JGa≈10⁻⁵ mole/cm²s≈0 at T=800° c.

This indicates that direct transport of gallium arsenide is not possible only by sublimation.

Transport of its separate components must therefore be considered. An alternative approach is the use of gallium chloride (Gacl) or gallium suboxide (Ga₂O) for the gallium component (DGa<DAs₂). GaCl is commonly used in the chloride vapor phase epitaxy for GaAs growth. HCL gas serves to transfer gallium to the substrate in form of GaAs growth. HCl gas serves to transfer gallium to the substrate in the form of GaCl as follows:

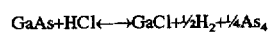

$$GaAs + HCl \leftarrow \rightarrow GaCl + \tfrac{1}{2}H_2 + \tfrac{1}{4}As_4 \qquad [7]$$

The growth process according to the invention is applicable to any solid which can react reversibly with a gas to form a volatile product, using water vapor, as transport reagent for gallium component. In the case of GaAs, the vapor transport reaction is usually expressed in the following form:

$$2GaAs(s)+H_2O(g) \leftrightarrow Ga_2O(g)+As_2(g)+H_2(g) \quad [8]$$

For the transport of GaAs on GaAs, these equilibria are established at two temperatures
1) GaAs source temperature $T_1$ and
2) GaAs source temperature $T_2$, which correspond to the respective surfaces separated by the spacer.

The arsenic dimer is the predominant species in the vapor phase at the temperatures used for transport.

Mass spectrometric evidence for the existence of the volatile vapor species $Ga_2O$ is known in the art.

In the equilibrium conditions, the equation [8] is written $$2GaAs+H_2O=Ga_2O+AS_2+H_2 \quad [9]$$

that could be composed by
a) reduction reactions $$2H^{+}+2e^{-} \rightarrow H_2$$

$$2Ga^{+++}+4e^{-} \rightarrow 2Ga^{+}$$

b) oxidation reaction $$2As^{---} \rightarrow As2+6e^{-}$$

the same argument is applied to the chloride reaction [7].

In the GaAs case, the SPE process is based on the oxidoreduction reaction. In this case, the growth rate is controlled by the surface reaction rate.

The driving force of the reaction is the displacement of the chemical equilibrium constants corresponding to the different source and substrate temperatures. From thermodynamic data, it can be shown that this reaction [9] is driven from left to right at higher temperatures (around 800° c.), that is, it is a decomposition reaction for the GaAs. The substrate is held at a lower temperature, typically 750° c. Here the same reaction occurs, except that it is now driven in the opposite direction so that it is a formation reaction for GaAs.

The overall effect is to transport GaAs from the surface source, where it is formed to the surface substrate on which it is epitaxially grown. The growth rates are high and are listed by the gas-phase diffusion coefficient and the concentration gradient of the reactive species.

The equilibrium constants K at $T_1$ and $T_2$ of the reaction involved in the transport can be given by:

$$K(T_1) = \frac{P_{Ga_2O}(T_1) P_{AS_2}(T_1) P_{H_2}(T_1)}{P_{H_2O}(T_1)} \quad [10]$$

$$K(T2) = \frac{P_{Ga_2O}(T_2) P_{AS_2}(T_2) P_{H_2}(T_2)}{P_{H_2O}(T_2)} \quad [11]$$

Independent of the temperature $$\frac{P_{H_2O}}{P_{H_2}} = r$$

is constant and $$P_{Ga_2O} = P_{AS_2} = p$$

equations [10] can be simplified $$K(T_1)r = P^2(T_1) = r \exp \frac{[-\Delta G^{\circ}(T_1)]}{RT_1}$$

at constant temperature $T_1 \Rightarrow P = \sqrt{rk}$
the pressure of reactive species is limited by source temperature and an external factor (r vapor water pressure) contrary to the case in the sublimation process where only the temperature controls this pressure.

Having described in general the SPE process, the preferred embodiments will now be set out. Referring to FIG. 1, the reaction chamber 1, which is preferably made of a fused silicon material, has a sealed end 3 and is closed at the other end with a tapered joint 5. As seen in FIG. 2, disposed inside the reaction chamber are a top graphite block 7 and a bottom graphite block 9. The material of the source wafer can be selected from the following: GaAs, CdTe, HgCdTe, ZnSe, Si, $Pb_{1-x} Gd_x Te$, AlGaAs, InGaAs, GaP. The material of the substrate may be selected by the following: GaAs, GaP, Ge, Si, KBr. The reaction chamber has a rectangular cross section. A rectangular tube is used instead of a standard circular tube for the main body to obtain a maximum temperature uniformity inside the reaction chamber.

The inside assembly is made of a heavy walled tube 10. As seen in FIGS. 3 and 5, a source wafer is supported on the graphite block 9, and a substrate wafer 13 underlies the graphite block 7. As spacers 15 are disposed between the wafers 11 and 13. The spacers 15 are approximately 0.3 mm thick. The spacers may be made of a fused silica or graphite material.

Graphite blocks 7 and 9 are heated by means illustrated at 24 in FIG. 3, block 19 (that is the source wafer) being kept at a higher temperature. These means may comprise three Ilkw glowbar (SiC) elements. The temperatures of the graphite blocks are monitored by thermo couples illustrated schematically at 17 and 19 in FIG. 3. The thermo couples are positioned in wells 21 and 23 of graphite blocks 7 and 9 in FIG. 4 respectively.

The tapered joint end of the reaction chamber includes a gas inlet 27 and a gas outlet 25 as shown in FIG. 2. The gas inlet may be formed by using 4×6 mm tubing and gas inserted into the reaction chamber through the gas inlet tube is brought to graphite blocks where the gases are permitted to flow between the blocks. The gas outlet may comprise a 4×6 mm tube extending from the tapered joint to the exterior.

Turning back to FIG. 3, it is seen that nitrogen gas cylinder 29 and hydrogen gas cylinder 31 are connected, through valves 33 and 35 respectively, to flow meter 37. The output of the flow meter is fed through valve 39 to a water saturator 38. It is also fed through valve 41 to gas inlet 25.

The output of the water saturator 38 is fed through valve 43 to the gas inlet 25.

The gas outlet 27 is connected to trap 45 which is, in turn, connected to glycerol bubbler 47. The output of 47 is fed to burner 49.

Prior to the deposition procedure, the reactor is first degassed at approximately 800° C. for one hour under dry hydrogen gas at a flow rate of 500 cc/min.

The samples are first introduced in the open reactor. The source wafer 11, facing upwardly, is placed on the bottom graphite block 9. The spacers 15 are positioned over the source, and the substrate wafer 13, facing downwardly, is placed on top of the spacer. The top graphite block 7 is then positioned over the substrate wafer 13, and the reaction chamber is then closed.

Nitrogen is then circulated in the reaction chamber, from cylinder 29, through valve 33, to the flow meter 37 at a rate of approximately 500 cc/min for 20 minutes. Dry hydrogen is then introduced, from cylinder 31, through valve 35, for 10 minutes at a flow rate of approximately 350 cc/min. A preheated furnace is then placed under the reaction chamber and wet hydrogen is circulated by passing hydrogen gas through the bubbler 47.

For GaAs, typical source temperatures of 850° C. are obtainable within 15 minutes.

Once this temperature is reached, a 30 minute deposition is made. A difference in temperature between the source wafer and the substrate wafer of 20° C. to 40° C. is maintained during the entire deposition procedure. When the reaction time is over, dry hydrogen is circulated through the system for 10 minutes. Finally, nitrogen is circulated in the reaction chamber until the sample temperature is near room temperature. In test results with the inventive apparatus, computerized Hall effect and deep level transient spectroscopy (DLTS) setups permitted the systematic analysis of the interactions of the vacancies or defects in GaAs. The generally accepted model of EL2 antisite complex in As-rich GaAs was modified by the introduction of a deep lying off-stoichiometry introduced acceptor level. This modification was invoked by our analysis of a large number of experimentally observed data using the multilevel impurity model. It is of interest to mention here that the quantitative interpretation of the measured transport properties of semi-conducting and semi-insulating arsenic-rich GaAs crystals requires a phase-extent induced Ga vacancy concentration of $V_{Ga}=3\times10^{17}$ cm$^{-3}$. This is the value deduced for gallium defects in silicon-doped GaAs from positron lifetime measurements. Thus, a multilevel impurity model based on the Shockley curves is supported. It was used successfully for the quantitative numerical analyses of more than 200 semi-conducting or semi-insulating arsenic-rich samples. It consisted of an assumed Ga vacancy concentration of n=$3\times10^{17}$ cm$^{-3}$; a shallow donor concentration, $N_{d1}$, representing silicon doping, an EL2 antisite deep donor concentration of $N_{d2}=f(N_1-N_{d1})$, where f is the fraction of remaining Ga vacancies occupied by arsenic atoms to form antisite complexes; an arsenic vacancy concentration, being an integral part of the antisite complex of $V_{As}=N_{d2}$ was included as well. Then according to this model the n type arsenic-rich crystal could become semi-insulating by deep acceptor compensation. Its concentration can be computed by $N_{a1}=N_1-(N_{d1}+N_{d2})$. Then, the calculated position of the fermi level, based on the neutrality condition, elucidates quantitatively by the occurrence of "undoped" SI GaAs. This model does not require the assumption of a shallow acceptor compensation related to the questionable presence of carbon contamination. This is required to turn the n-type crystal to p-type to be compensated by the EL2 deep donors. The treatment does not need the neglect of the antisite complex based arsenic vacancies. $V_{As}=EL2$, which being shallow donors, are compounding the difficulty of the deep-level compensation model. This does not require the assumption of carbon contamination to introduce the needed acceptors.

This is a simple, cost-effective non-toxic epitaxial set-up which can readily be up scaled for industrial production.

Hall effect measurements were performed on undoped epitaxial layers, deposited on SI GaAs substrates using undoped SI GaAs sources. In proper growth conditions, electron mobilities in the range of 4000 cm$^2$V$^{-1}$S$^{-1}$ at (300)K, for a n type background doping in the range of $5\times10^{16}$ cm$^{-3}$, were typically obtained as seen in FIG. 7. Furthermore, the measured carrier concentration were in good agreement with the charge density data obtained from the photo corrosion measurements. These studies revealed the influence of the substrate doping on the impurity content of the epitaxial layers as well as the possibility of doping the deposits by using impurities of the GaAs source. Indeed when Te-doped sources were used, an effective transfer of Te impurity was observed leading to relative high n-type doping of the layers. On the other hand, using highly Zn doped source, p type layers showing a hole concentration in the range of $10^{18}$ cm$^{-3}$ at 300K are obtained. The following results were obtained on non-intentionally doped n type GaAs epitaxial layers.

Theoretical computations of electron mobilities based on a variational method including all major scattering processes and screening effects have been completed. The results on the calculated electron mobilities at 77K, as a function of the free carrier concentration at different compensation ratios are shown in FIG. 7. The measured Hall mobilities at 77K are also plotted (open squares) against the free carrier concentration of the SPE samples. They are showing a compensation ratio $\Theta$, defined as $\Theta=N_A-/N_D^+$, in the range of about 0.4.

Figure 8B:
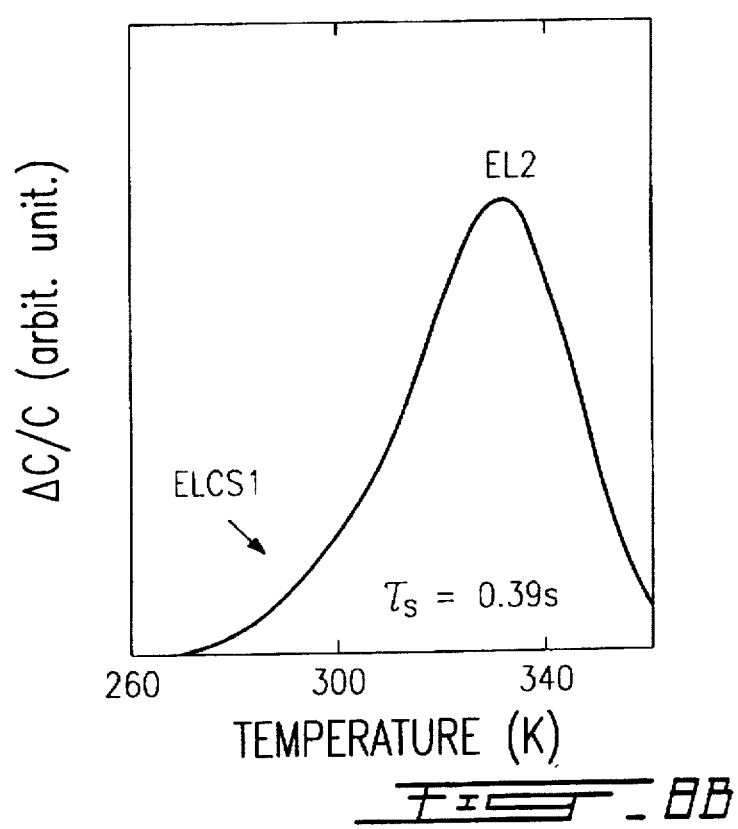
FIG. 8B is the same as FIG. 8A but with the Schottky diode redeposited after removal of about 1 μm from the surface sample by chemical etching.

FIG. 8A represents a typical DLTS spectra for an epitaxial GaAs layer grown at a substrate temperature of 860° C. The curve was obtained for Schottky diode prepared on the As grown surface. Two electron traps were detected. Their apparent activation energy and their capture cross-section are $\Delta E=0.78$ eV, $\sigma=1\times10^{-12}$ cm$^2$ and $\Delta=0.81$ eV, $\sigma=2.1\times 10^{-13}$ cm$^2$ respectively. The first one labelled ELCS1 has a signature close to the level EL12 one according to the Martine et al.'s classification. The second one was identified as the well known electron trap EL2 characteristic of arsenic-rich GaAs. The curve presented in FIG. 8B was obtained for Schottky diode redeposited after removal of about 1 µm from the surface sample by chemical etching. This study indicates that the deep donor EL2 is uniformly distributed through the layer thickness. As it can be seen in FIG. 8B, the ELCS1 trap concentration decreases from the As grown surface to the bulk at a concentration level lower than the EL2 one, depending on the growth conditions.

Figure 9:
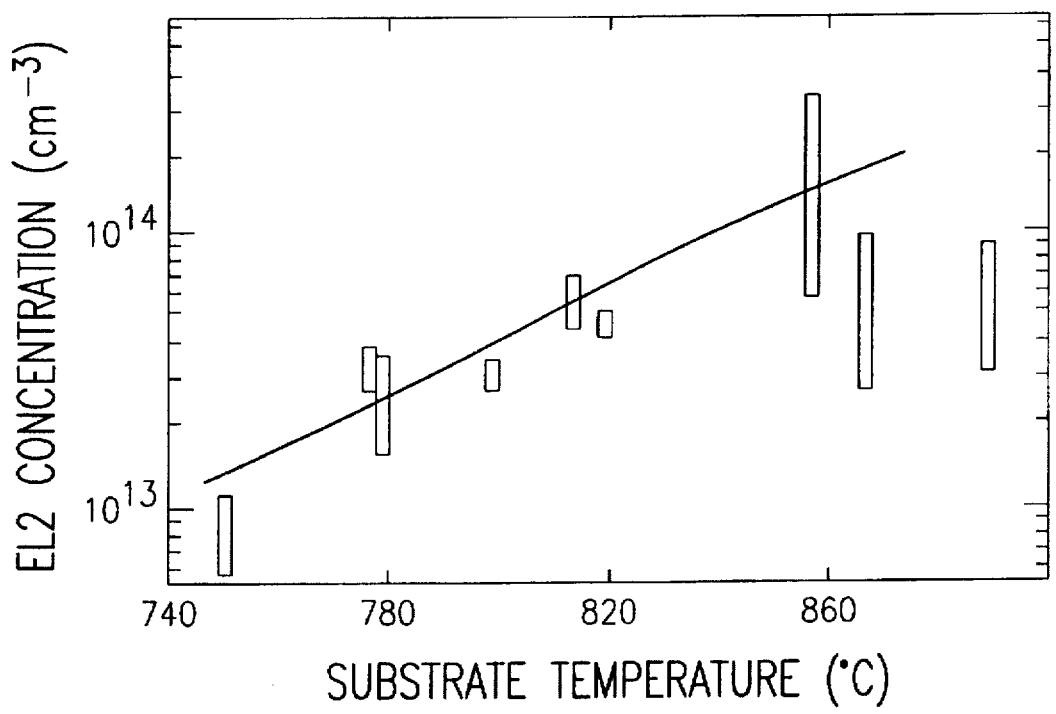
FIG. 9 illustrates the evolution of the EL2 trap concentration versus substrate temperature.

The substrate temperature dependence of the EL2 trap concentration is depicted in FIG. 9. It can be seen that the EL2 concentration monotonically increases with increasing substrate temperature indicating the possible increase of the gallium vacancy concentration.

The detailed examination of the reaction mechanisms showed that the depositions were always performed under arsenic rich conditions. This enables the formation of phase extend induced defects related to the gallium vacancy such as EL2 type antisite rich GaAs indicated the existence of a native deep acceptor level. This deep off-stoichiometry induced acceptor level would exist in conjunction with the EL2 native deep lying donor level in As rich GaAs. In our previous calculations and in this communication, this deep native acceptor is represented by the Gallium vacancy. The theoretical GaAs solidus curves indicate an increasing phase extension with increasing temperature between about 700 and 1130 C. Consequently, the following multilevel impurity model based on a Shockley analysis is enhanced to explain the EL2 trap concentration behaviour with the substrate temperature as observed in FIG. 9.

In arsenic rich GaAs, a phase extent dependent Gallium vacancy ($V_{Ga}$) Concentration of $N_1=3\times10^{17}$ cm$^{-3}$ was successfully used previously in the quantitative elucidation of the transport properties of GaAs. $N_{d1}$ is the concentration of shallow donors impurities occupying the gallium site. According to the mechanism of the EL2 complex ($V_{As}$+ $As_{Ga}$) formation described by Lagowski et al., the concentration of the EL2 antisite is given by $N_{d2}=fx(N_1-N_{d1})$. Where f is the fraction of the remaining gallium vacancies ($N_1-N_{d1}$) occupied by arsenic. The shallow level concentration associated to the arsenic vacancy is $[V_{As}]=N_{D2}$. The remaining gallium vacancy after the formation of shallow donors and EL2 antisites, is assumed to form a deep acceptor as discussed before. Its concentration is computed by $N_{a1}=N_1-(N_{d1}+N_{d2})$. Taking into account the observation of Gatos et al., that EL2 concentration exhibits in the case of epitaxial growth at about 700 C. in contrast to melt growth at 1238° C. a 2-3 order of magnitude decrease, in this communication the fraction of the gallium vacancy contributing to EL2 complex formation was decreased from f=0.15 to f=0.015. All the parameters of the model were maintained unchanged. The shallow donor concentrations were assumed to be represented by silicon at a constant level of $N_{d1}=5.8\times10^{16}$ cm$^{-3}$ for the undoped layers, based on previous results. Then taking the activation energies of these impurities as 0.002 eV for silicon, 0.76 eV for the deep lying divalent donor state of the arsenic antisite, EL2, 0.025 eV for the arsenic vacancy and 0.25 eV for the deep acceptor gallium defects as in our previous calculations, the position of the Fermi level, giving the ionized impurity concentrations with the free electron density, based on the neutrality condition, was computed.

Figure 10:
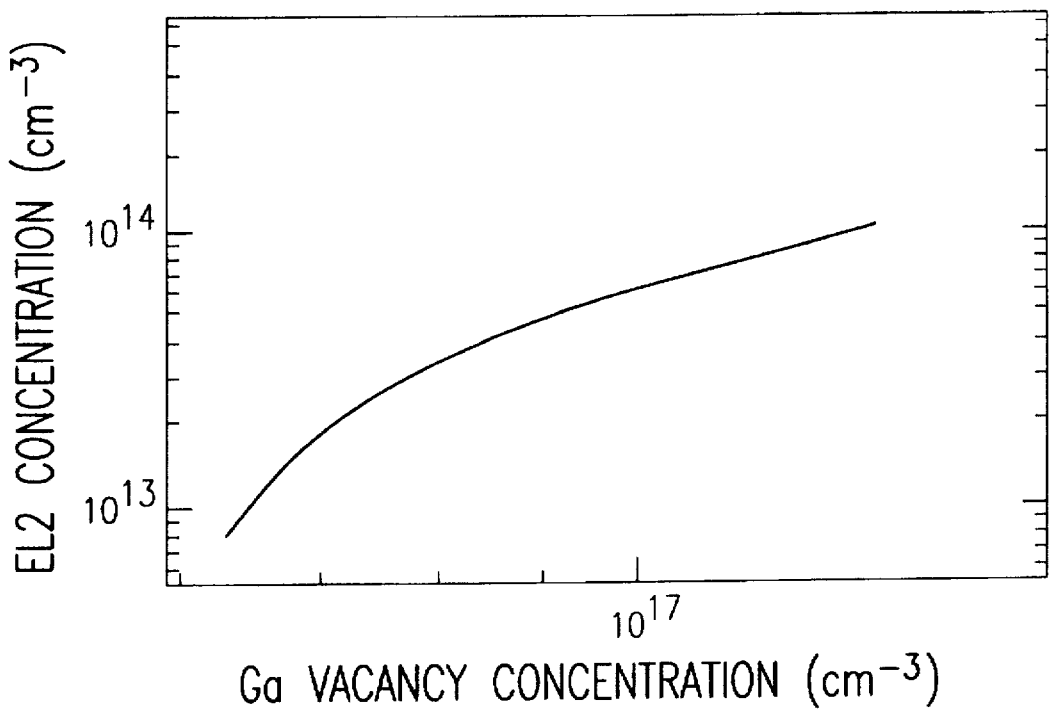
FIG. 10 illustrates calculated EL2 trap concentration as a function of off-stoichiometry-induced gallium vacancy and $N_1$ treated by the multi-level impurity technique.

The results are depicted in FIG. 10, where the calculated EL2 concentration as a function of the off-stoichiometry induced gallium vacancy density, $N_1=[VGa]$, is shown. To represent the variation of DLTS measured EL2 concentration as a function of the deposition temperature, as represented in FIG. 4, the off-stoichiometry induced gallium vacancy concentration, $N_1$, was required to evolve from $6\times10^{16}$ to $1.1\times10^{17}$ cm$^{-3}$. Comparing the DLTS measured EL2 concentrations as a function of the deposition temperature in FIG. 4 and those computed by the multi level impurity model based on the phase extend induced off-stoichiometry of FIG. 10, an acceptable agreement can be noticed.

Advantages of SPE Process Over the Prior Art
1. Faster manufacturability (3 to 30× faster than the competition).
2. Lesser material loss (greater than 90% efficiency, competition's efficiency is in the 40% vicinity).
3. Simplicity and compactness of operation (required set up).
4. Non-usage and storage of highly toxic (hydrures) or corrosive (HCl) gases necessary in the competition's process.
5. Production (with our process) can be carried out at atmospheric pressure and at moderate temperatures. Therefore sophisticated and expensive vacuum systems are not needed.
6. Technological advancements in fabrication process over the competition.

EXAMPLE I

The following growth parameters in the epitaxial growth of GaAs on SI GaAs were studied.

The temperature difference, ΔT, between the source and substrate, during the heating up time and during the deposition was compared to the quality of the epitaxial surface finish.

The substrate temperature, $T_{sub}$, was varied from 720° C. to 880° C. to see the evolution of the carrier concentration and mobility with the substrate deposition temperature.

The spacer was changed from fused silica to graphite to see if the doping mechanism was influenced by the spacer material.

The source material was changed from SI GaAs to Zn doped GaAs and Si doped GaAs to see the effect on the carrier concentration and mobility.

Other parameters such as the partial pressure $H_2O$ and the spacer thickness have been investigated.

Epitaxial depositions of GaAs with mirror smooth surface finishes were obtained reproducibly. Such mirror smooth finishes of SPE grown GaAs layers on (100) oriented GaAs substrates have been oriented using x-ray diffraction. These layers were also oriented in the (100) direction. Mirror finishes could be obtained by controlling the temperature gradient between the source and the substrate during the temperature rise in the reactor. From the data compiled, it could be seen that ΔT during the temperature rise ($\Delta T_{rise}$) must be greater than ΔT during the deposition ($\Delta T_{dep}$) to achieve mirror finishes. The collected data is shown in Table 1.

TABLE 1

Influence of ΔT on the Surface Finish of the Epitaxial Depositions

| Substrate Temp (°C.) | $\Delta T_{rise}$ (°C.) | $\Delta T_{dep}$ (°C.) | Mirror Finish |
|---|---|---|---|
| 730 | 40 | 74 | no |
| " | 58 | 30 | yes |
| " | 73 | 74 | no |
| 750 | 40 | 52 | no |
| " | 65 | 50 | yes |
| " | 40 | 40 | no |
| 770 | 40 | 30 | yes |
| " | 40 | 70 | no |
| 800 | 55 | 34 | yes |
| " | 40 | 40 | no |

TABLE 2

Fused Silica Versus Graphite Spacer

| Source temperature | Quartz spacer | | Graphite spacer | |
|---|---|---|---|---|
| | n (cm$^{-3}$) | μ (cm$^2$/V-s) | n (cm$^{-3}$) | μ (cm$^2$/V-s) |
| 750° C. | 3.3 × 10$^{17}$ | 2980 | 3.4 × 10$^{16}$ | 3300 |
| 800° C. | 2.3 × 10$^{17}$ | 2940 | 6.1 × 10$^{16}$ | 3030 |
| 840° C. | 1.1 × 10$^{17}$ | 3290 | 8.6 × 10$^{16}$ | 3070 |

To further understand the doping mechanism, the undoped SI GaAs sources were replaced by Zn doped GaAs sources. The carrier concentrations and mobilities measured in these epitaxial layers are listed in Table 3.

TABLE 3

Characteristics of GaAs Epitaxial Layers using Zn doped sources

| Subs. temp | n (cm$^{-3}$) | μ (cm$^2$/V-s) |
|---|---|---|
| 808° C. | 6.2 × 10$^{15}$ | 1980 |
| 808° C. | 8.5 × 10$^{15}$ | 2800 |
| 820° C. | 5.4 × 10$^{15}$ | 2600 |

Although Zn is a shallow acceptor in GaAs, the epitaxial layers were n type. Even though the carrier concentrations were low, the mobilities were not as high as expected. This indicates a certain degree of compensation or the result of parasitic side reactions.

Si doped sources were also used. Unfortunately no ohmic contacts could be obtained on the epitaxial layers. Hence no electrical characterization could be made.

EXAMPLE II

The parameters that have been varied in Example 2 were a) the hydrogen flux, b) the thickness of the graphite spacer, c) the source and substrate temperature, d) the source (semiconductor), and e) the spacer material.

In FIGS. 11 to 14, the results obtained for the different spacers (where applicable) and different conditions for each spacer are compared. The water used as a transport reagent was kept at 0 degrees celsius for all experimental work.

FIG. 11 shows the variation of the growth rate (µm/min) versus the spacer thickness (mm). This variation was only performed with the semiconductor grade graphite blocks and spacers. The spacers ranged from 0.3 to 0.9 mm in thickness. The growth rate in the above figure is defined as, $$\text{Growth Rate} = d(\mu m)/t \text{ (min)}$$

where d is the deposited film thickness and t is the deposition time. The deposition time used for FIG. 11 was 20 minutes. The temperature for this experiment was 1073K for the source and 1023K for the substrate. The hydrogen flow during deposition time was maintained at 500 cc/min.

FIG. 12 shows the variation of the growth as a function of temperature. The semiconductor graphite spacer and blocks were used for the results of FIG. 12. The temperatures used (for the source) were 1013, 1023, 1033, and 1073K and the deposition time was also 20 minutes. From the above figures, it can be seen that as the temperature increases, the growth rate also increases. At 1023 and 1033K the growth rate is the same. This is due to the positioning of the samples on the graphite blocks. Some variation of temperature does exist along the blocks. Normally, the samples are set as much as possible in the center of the blocks. However, if the samples are set much further away from the center, the effective temperature can be altered. Because of the positioning, the actual temperature of the source sample was not 1033K (as measured from the center of the graphite blocks) but 1023K. This explains the similar results. The results presented in FIG. 12 were obtained by using the semiconductor graphite blocks and spacer of 0.8 mm.

Figure 13:
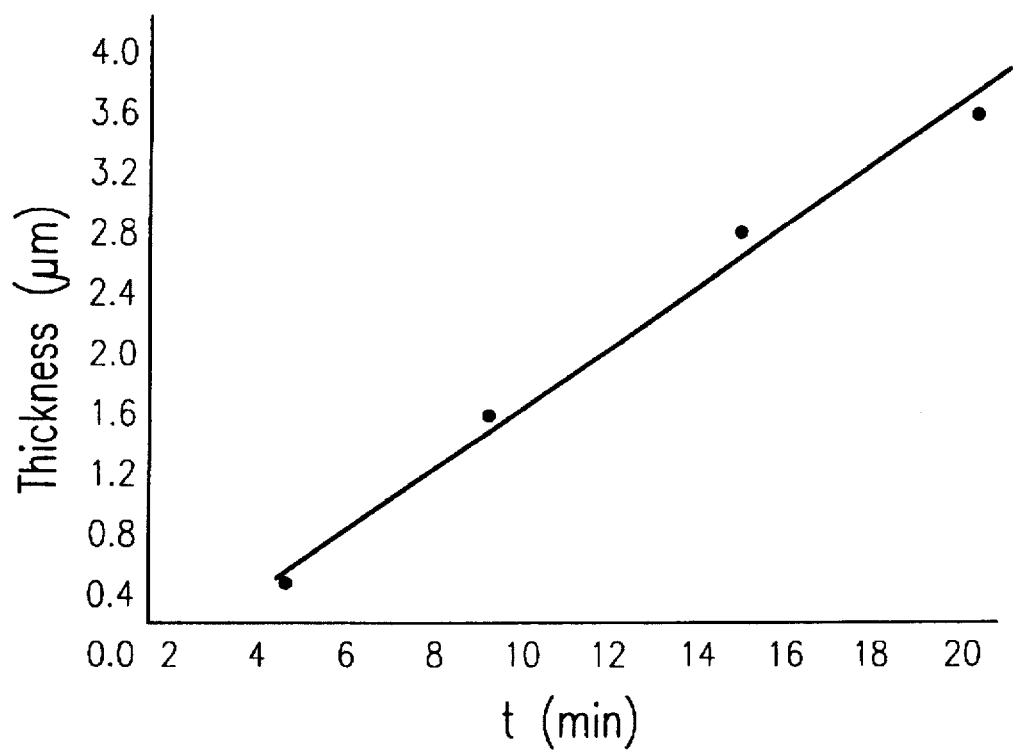
FIG. 13 is a plot of thickness vs time for Example 2.

FIG. 13 shows the thickness dependence on deposition time. As expected, the thickness increases with deposition time.

Figure 14:
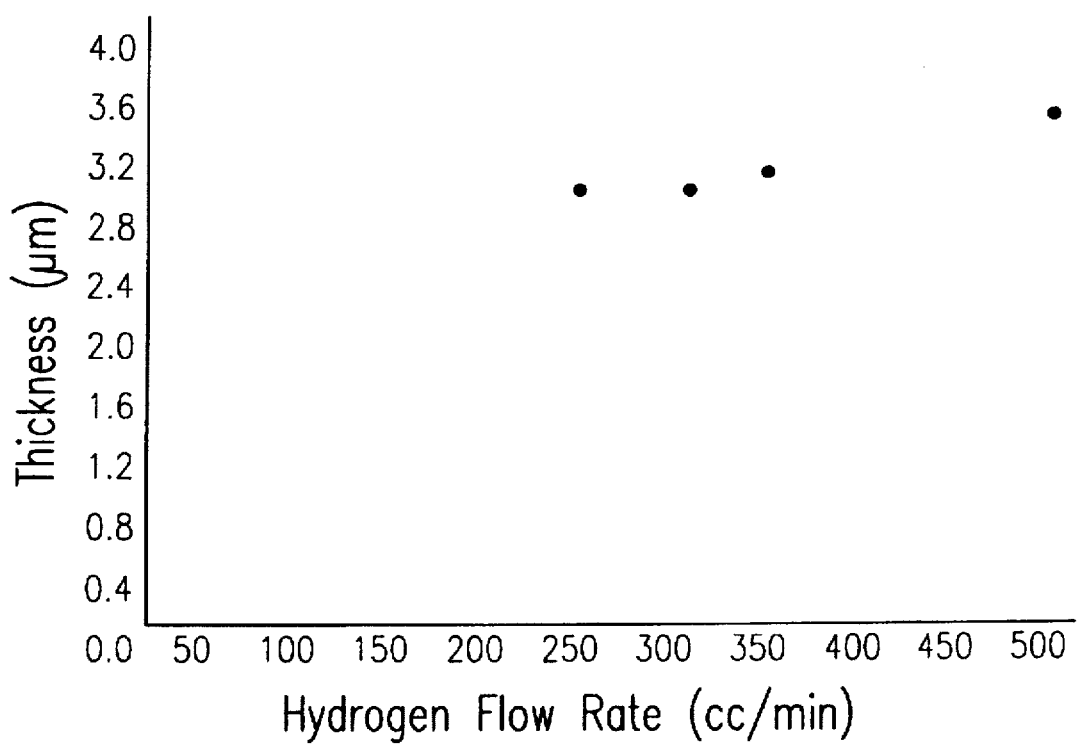
FIG. 14 is a plot of thickness vs hydrogen flow rate for Example 2.

FIG. 14 illustrates the thickness versus the hydrogen flow. The difference between the samples measured was 0.4 µm. As previously shown, hydrogen flow does not affect the growth rate or thickness. The measurements from FIGS. 13 and 14 were obtained using a 0.3 mm boron nitride spacer. The deposition temperature was 1023K and the hydrogen flow rate for FIG. 13 was of 350 cc/min.

Although a particular embodiment has been described, this was for the purpose of illustrating, but not limiting, the invention. Various modifications, which will come readily to the mind of one skilled in the art, are within the scope of the invention as defined in the appended claims.

I claim:

1. A deposition process for growing uniform thickness layers of material, comprising:

disposing a source wafer and a substrate wafer substantially parallel to one another within a reaction chamber, said source wafer comprising said material;

providing a transport agent vapor in said chamber substantially at atmospheric pressure;

causing said vapor to flow substantially evenly across said wafers;

setting a space between said source wafer and said substrate wafer to less than a mean free path of a reactive species of oxido-reduction of said material;

heating said source wafer and said substrate wafer substantially evenly with a difference in temperature between said source wafer and said substrate wafer; and maintaining said temperature difference between said source wafer and said substrate wafer to effect deposition of said material transported from said source wafer to said substrate wafer as a result of oxidoreduction reaction of said material, said vapor and said substrate.

2. Apparatus for performing deposition for growing layers of a material on a substrate wafer, said material being transferred from a source wafer to the substrate wafer by a transport agent vapor as a result of oxido-reduction reaction, comprising:

a reaction chamber able to contain said vapor at substantially atmospheric pressure;

means for mounting said substrate wafer and said source wafer substantially parallel to one another in said reaction chamber;

means for maintaining a spacing between said substrate wafer and said source wafer by a distance which is less than the mean free path of the reactive species of oxido-reduction of said material;

gas outlet means for causing said vapor to flow substantially evenly across said wafers;

means for substantially evenly heating said wafers; and means for maintaining a temperature difference between said wafers.

3. A process as defined in claim 1 wherein said source wafer is maintained at the higher temperature.

4. A process as defined in claim 3 wherein the material of said source wafer is selected from:

GAAS, GaAlAs, InGaAs, GaP, CdTe, HgCdTe, ZnSe, Si, $Pb_{1-x}Gd_x$ Te.

5. A process as defined in claim 4 wherein the material of said substrate wafer is selected from:

GaAs, Ge, Si, KBr, GaP.

6. Apparatus as defined in claim 2 wherein said source wafer and said substrate wafer are mounted on facing surfaces of two spaced graphite blocks.

* * * * *